United States Patent [19]

Jones, Jr.

[11] Patent Number: 4,673,868
[45] Date of Patent: Jun. 16, 1987

[54] METHOD OF TESTING ELECTRONIC AUTOMOTIVE PARTS

[76] Inventor: Rolin Jones, Jr., 4103 Pardee St., Houston, Tex. 77026

[21] Appl. No.: 885,373

[22] Filed: Jul. 11, 1986

Related U.S. Application Data

[63] Continuation of Ser. No. 671,623, Nov. 15, 1984, abandoned.

[51] Int. Cl.$^4$ ............................................. G01R 31/02
[52] U.S. Cl. .................................... 324/51; 324/73 R
[58] Field of Search .......... 324/51, 52, 158 R, 158 D, 324/73 R; 340/52 F, 52 R; 73/118

[56] References Cited

U.S. PATENT DOCUMENTS

| | | | |
|---|---|---|---|
| 3,899,737 | 8/1975 | Aston | 324/158 D |
| 3,936,744 | 2/1976 | Perlmutter | 324/73 R X |
| 4,112,748 | 9/1978 | Walley | 324/158 F X |
| 4,222,005 | 9/1980 | Naito | 324/416 X |

OTHER PUBLICATIONS

Stockel, Auto Mechanics Fundamentals, 1974, pp. 383–391.

*Primary Examiner*—Reinhard J. Eisenzopf
*Assistant Examiner*—Jack B. Harvey
*Attorney, Agent, or Firm*—Reginald F. Roberts, Jr.

[57] ABSTRACT

A method for testing electronic automotive components. Apparatus required is an electrical device which includes a pair of probes, a source of direct current, and a bifunctional current detector. The current detector includes a buzzer and an incandescent lamp. The positive terminal is connected to the current detector, and the negative terminal to one of the probes. The current detector is connected to the other probe. The probes are then placed in contact with the component being tested, and an observation is made as to whether or not a current is detected by the current detector. The detection or failure to detect a current provides a signal indicative of the condition of the component tested.

7 Claims, 14 Drawing Figures

FIGURE 13

METHOD OF TESTING ELECTRONIC AUTOMOTIVE PARTS

CROSS-REFERENCE TO RELATED APPLICATION

This is a continuation of application Ser. No. 671,623 filed Nov. 15, 1984, now abandoned.

BACKGROUND OF THE INVENTION

This invention relates to the testing of electronic parts. More particularly, the invention relates to the electrical testing of electronic automotive components.

Two very important automotive components falling within the scope of the present invention are alternators and voltage regulators. The typical alternator is a three-phase, Y-wound unit with a six-diode rectifier. Current is supplied to the rotor (rotating field) through slip rings. When the automotive vehicle is inoperative, the field is disconnected from the battery either by opening the ignition switch or by opening field-relay contacts. The six-diode rectifier changes the alternating current to the direct current required by the vehicle electric system.

A typical voltage regulator has two sets of contacts, lower and upper. At intermediate speeds, the lower contacts open and close, inserting and removing a resistance in the alternator field to provide voltage-limiting action. At higher speeds, the resistance is not sufficient to hole the voltage down. As the voltage increases, the upper contacts begin to make and break contact. When the contacts close, the alternator field is grounded by the contacts. With both ends of the field grounded, additional regulation is achieved.

The alternator has a field relay which connects the alternator field to the battery when the ignition switch is closed; and disconnects the field from the battery when the ignition switch is opened, thereby shutting off the engine. This technique keeps the battery from discharging through the alternator field. An indicator light comes on when the ignition is first turned on, to indicate that the alternator is not charging. As soon as the alternator begins to charge the battery, the alternator voltage closes the field-relay contacts. With both sides of the indicator light connected to the insulated terminals of the battery, the light goes out, indicating that the alternator is charging the battery.

A more comprehensive description, including wiring diagrams, of automotive alternators and voltage regulators is contained in the *McGraw-Hill Encyclopedia of Science and Technology*, vol. 1, pp. 323-324, and vol. 14, p. 420. Said portions of the *McGraw-Hill Encyclopedia* are hereby incorporated by reference.

The present state of the art requires the dissassembly and testing of individual parts of alternators and voltage regulators when preliminary on-line tests fail to pinpoint the source of the defect or trouble spot. The disassembling and piece-by-piece testing of the parts is time-consuming and inefficient. Moreover, the test devices used are diverse, and the methodology requires a substantial background of technical experience and judgment. It would be greatly beneficial to have a simple inexpensive device for detecting and pinpointing defective parts of electronic automotive components without the necessity of disassembling the components and testing each part individually and separately.

Furthermore, it would be highly desirable to provide test apparatus which could be used by unskilled personnel, and in particular by the handicapped. Specifically, it would be of great benefit to industry and to society to have available test equipment which could be used by persons who are blind or deaf.

SUMMARY OF THE INVENTION

In general, the present invention provides an electrical device and a method for testing electronic automotive components. The test device consists of first and second probes, a source of direct electrical current, and a current detector. The first and second probes are used to establish electrical contact with the component to be tested. The source of direct current includes first and second terminals of opposite polarity, to provide current for the electrical test device. The second terminal of the current source is connected to the second probe. The current detector consists of an electro-acoustic transducer and an electro-visual transducer. The detector is connected to the first probe and to the first terminal of the current source. The current detector, the current source, and the first and second probes form, in combination, an open circuit with an opening between the first and second probes. The current detector provides means for the detection or failure to detect the passage of a current through the circuit when the probes are placed in electrical contact with the electronic automotive component. The detection or failure to detect a current provides a signal indicative of the condition of the electronic automotive component.

The method for testing electronic automotive components comprises the following steps:

(a) Connecting the first terminal of the source of direct current to the current detector.

(b) Connecting the current detector to the first probe.

(c) Connecting the second terminal of the source of current to the second probe.

(d) Contacting the first and second probes with the component being tested, thereby forming a circuit which includes the first and second terminals of the current source, the first and second probes, the current detector, and the component being tested.

(e) Observing whether an electrical current is detected by the current detector. The detection or failure to detect the passage of a current provides a signal indicative of the condition of the electronic automotive component.

These and other aspects of the invention will be apparent to those skilled in the art from the foregoing description and from the more detailed description which follows.

BRIEF DESCRIPTION OF THE DRAWINGS

FIG. 1-*a* is a schematic diagram of a first embodiment of a test device made in accordance with the principles of the present invention. The diagram shows an electronic automotive component connected to the test device.

FIG. 1-*b* is a schematic diagram of a second embodiment of a test device made in accordance with the principles of the present invention.

DESCRIPTION OF THE PREFERRED EMBODIMENTS

The following description illustrates the manner in which the principles of the present invention are applied, but is not to be construed as in any sense limiting the scope of the invention.

Figure 1:
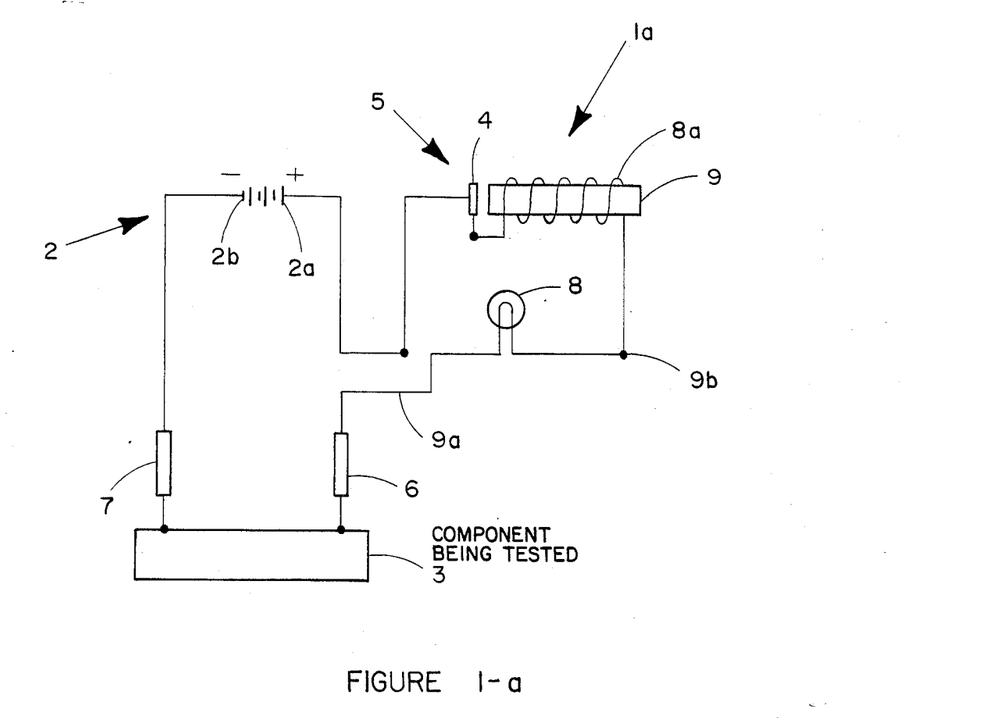

More specifically, two embodiments 1a and 1b of a test device made in accordance with the principles of the invention are shown in FIGS. 1-a and 1-b, respectively. The test device 1a, 1b consists of a battery 2 which includes a positive first terminal 2a and a negative second terminal 2b, and first and second insulated probes 6 and 7, respectively, for making electrical contact with an electronic automotive component 3 which is to be tested. The individual components of the test device 1a, 1b are connected to one another and to the automotive component 3 by conductors 9a and contacts 9b. The conductors 9a are preferably metal wires. The contacts 9b may be electrical plugs, clips, clamps, or other equivalent means well known in the art. The probes 6 and 7 are made of a conductor such as iron, steel, or copper. The wires 9a are preferably insulated.

The test device 1a, 1b further consists of a buzzer 5, which includes a metallic contact 4, an iron core 9, and a metal coil 8a wound around the iron core 9. Initial passage of current through the coil 8a induces a magnetic field which attracts the contact 4, thereby breaking the electrical circuit. When the circuit is broken, current no longer flows through the coil 8a, and the contact 4 returns to its original position, thereby reestablishing electrical contact and closing the circuit. This sequence is repeated, and the result is a buzzing sound caused by the making and breaking of the electrical contact. The buzzer 5 thus serves as one embodiment of an electro-acoustic transducer which is a component of the test device 1a, 1b.

The electrical device 1a, 1b further consists of an incandescant electric lamp 8. The electric lamp 8 represents one embodiment of an electro-visual transducer which is a component of the device 1a, 1b. The lamp 8 serves as a current detector by lighting up when current is passing through the circuit. By including both the buzzer 5 and the lamp 8 in combination, the versatility and usefulness of the device 1a, 1b are increased, since the device 1a, 1b can be used by either a deaf person or a blind person. Moreover, as will be shown hereinafter by illustrative examples, both the buzzer 5 and the lamp 8 are required for testing certain automotive components.

While the buzzer 5 and lamp 8 represent embodiments of an electro-acoustic transducer and of an electro-visual transducer, respectively, made in accordance with the principles of the present invention, other examples of each type of transducer will readily occur to those skilled in the art. For the purpose of illustration only, other examples of suitable electro-acoustic transducers include, but are by no means limited to, electric bells, horns, and sirens. Likewise, other examples of suitable electro-visual transducers include, but are not limited to, devices for the production or elimination of a color, devices for causing a change of color, and devices for causing a change in the shade of a color. The construction and use of such devices are well known in the electrical art.

While the battery 2 is shown as the current source in FIGS. 1a and 1-b, it is to be understood that any source of direct current may be used which provides a current which is substantially constant and steady throughout the test. Thus, a direct-current outlet, or an alternating-current outlet combined with means such as a.c. to d.c. converter for converting the alternating current to direct current, is an equivalent of the battery 2. As is well known in the art, power supplies are used to convert alternating current to direct current. The components of a d.c. power supply include a voltage controller, a rectifier, and a filter. A power transformer provides alternating current at a prescribed voltage as an input to the power supply. A diode or combination of diodes is used as a rectifier to convert alternating current into pulsating direct current. The filter smooths out the pulsating direction current and provides almost pure, steady direct current. For further refinement, voltage regulators are used to provide substantially constant and steady direct current.

A specific example of a satisfactory combination for the device 1a, 1b includes a thirty-three volt battery 2, a twelve-volt buzzer 5, and a twelve-volt incandescrnt lamp 8. As illustrated in FIGS. 1-a and 1-b, the buzzer 5 and lamp 8 may be connected in series or in parallel. When they are connected in parallel, it is beneficial to adjust, if necessary, the resistances through the buzzer 5 and lamp 8 branches of the circuit to be approximately equal. Such an adjustment is easily made by putting a resistor (not shown) in series with the buzzer 5 or the lamp 8.

The use of the present invention to detect, locate, and identify defective components or component parts will now be ilustrated by specific examples. It is to be understood, however, that the examples are solely for the purpose of demonstrating the principles and manner of using the invention, and are not to be construed as in any way limiting the scope of the invention.

In the examples which follow, it is to be understood that any results contrary to those specified indicate a totally or partially defective component or part. Each example is illustrated by a corresponding drawing figure, and reference thereto will greatly aid in understanding the principles illustrated by the examples.

EXAMPLE 1

Ford Alternator, Model No. 45V60AD7AF

Figure 2:
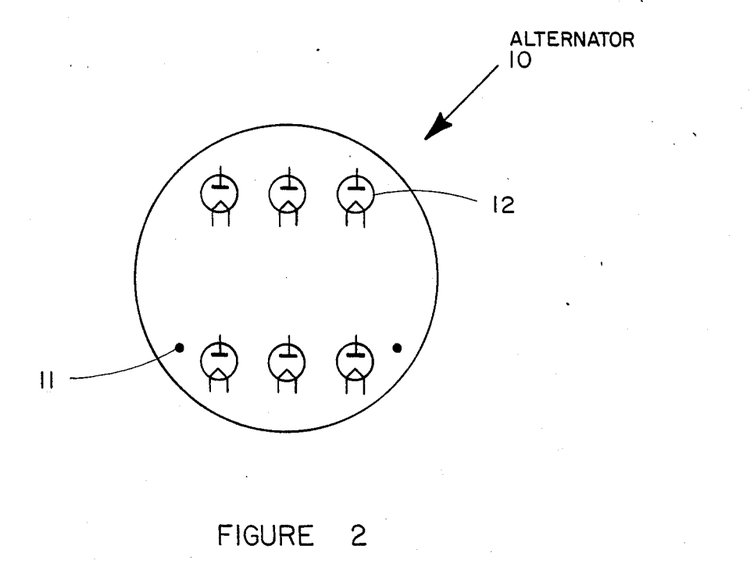
FIG. 2 is a schematic diagram of a Ford alternator, Model No. 45V60AD7AF, showing only those features of the alternator which are pertinent to the invention.

FIG. 2 is a schematic representation of a Ford alternator, Model No. 45V60AD7AF, indicated generally by the numeral 10. Only those parts of the alternator 10 which are pertinent to the discussion which follows are shown in the drawing. The alternator 10 includes a pair of ground posts 11 and a set of six diodes 12. The first probe 6 of the test device 1a, 1b was placed in contact with one of the ground posts 11, and the second probe 7 was touched, one diode at a time, to each of the diodes 12 of a first alternator 10. Observation was made as to whether contact with each of the diodes 12 resulted in a buzzing sound generated by the buzzer 5. The second probe 7 was then touched to one of the ground posts 11, and the first probe 6 was touched in turn to each of the diodes 12. A second set of observations was made as to whether contacting each of the diodes 12 resulted in a buzzing sound from the buzzer 5 and/or illumination of the lamp 8. All of the diodes 12, when contacted as described, caused the buzzer 5 to buzz and the lamp 8 to glow in the first series of tests. None of the diodes 12 caused the buzzer 5 to buzz or the lamp 8 to glow in the second series of tests. These results indicated that the first alternator 10 was in good condition, i.e. not wholly or partially defective. the same two series of tests were repeated for and with a second alternator 10. In this case, no buzz or lighting was observed for the first series of tests, an buzzing and lighting was observed for each of the six diodes 12 in the second series of tests. These results indicated that the second alternator 10 was also in satisfactory condition.

EXAMPLE 2

Sears Solid State Voltage Regulator,

Model No. 1487, for Chrysler Products

Figure 3:
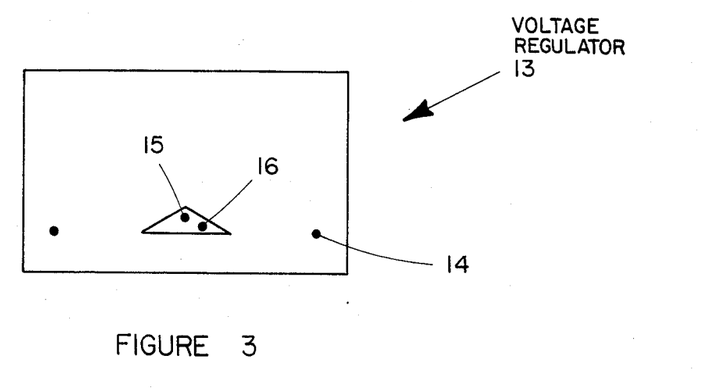
FIG. 3 is a schematic diagram of a Sears solid state voltage regulator, Model No. 1487, for Chrysler products, showing only those features of the regulator which are pertinent to the invention.

FIG. 3 is a schematic representation of a Sears solid state voltage regulator, Model No. 1487, for Chrysler products, the regulator being indicated generally by the numeral 13. Only those parts of the regulator 13 which are pertinent to the discussion which follows are shown in the drawing. The voltage regulator 13 includes a pair of ground posts 14, a first connector post 15, and a second connector post 16. When the probe 6 was touched to the first connector post 15 and the probe 7 to one of the ground posts 14, a low buzzing sound was heard. When the probe 6 was touched to the second connector post 16, a loud buzzing sound was heard. These results indicated that the voltage regulator 13 was in satisfactory condition.

EXAMPLE 3

Sears Solid State Voltage Regulator,

Model No. 1425, for Ford Products

Figure 4:
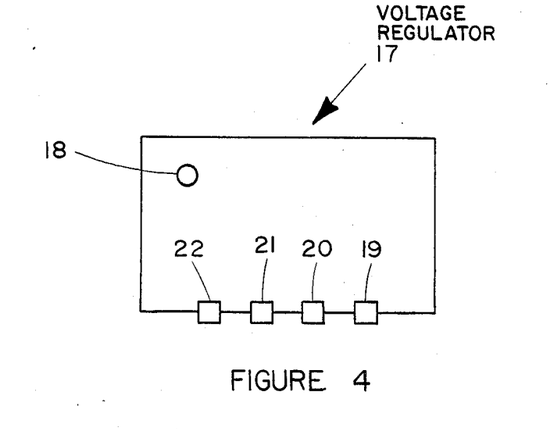
FIG. 4 is a schematic diagram of a Sears solid state voltage regulator, Model No. 1425, for Ford products, showing only those features of the regulator which are pertinent to the invention.

FIG. 4 is a schematic representation of a Sears solid state voltage regulator, Model No. 1425, for Ford products, indicated generally by the numeral 17. Only those components of the voltage regulator 17 which are pertinent to the description which follows are shown in the drawing. The voltage regulator 17 includes a ground post 18, an ignition post 19, an alternator post 20, a stator post 21, and a field post 22.

The probe 6 was grounded, e.g. by contacting the post 18. The probe 7 was touched to the ignition post 19. A buzzing sound was heard. With the probe 6 still grounded, the probe 7 was touched to the alternator post 20 of the regulator 17. A buzzing sound was heard. With the probe 6 still grounded, the probe 7 was then touched to the stator post 21. A buzzing sound was not heard, but a dim light was seen in the lamp 8. With the probe 6 still grounded, the probe 7 was touched to the field post 22. A buzzing sound was heard. These results indicated that the voltage regulator 17 was in good condition.

EXAMPLE 4

Ford Mechanical Voltage Regulator, Model No. RV118

Figure 5:
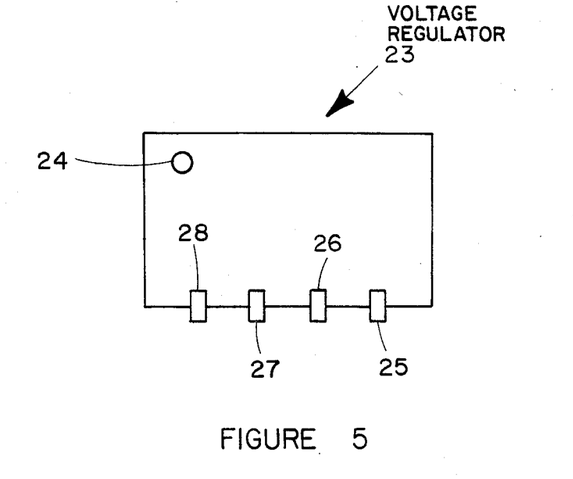
FIG. 5 is a schematic diagram of a Ford mechanical voltage regulator, Model No. RV118, showing only those features of the regulator which are pertinent to the invention.

FIG. 5 is a schematic representation of a Ford mechanical voltage regulator, Model No. RV118, designated generally as 23. Only those components are shown which are pertinent to the test described hereinbelow. the voltage regulator 23 includes a ground post 24, an ignition post 25, an alternator post 26, a stator post 27, and a field post 28. The probe 6 was touched to the ground post 24 (or otherwise grounded), and the probe 7 as touched to the ignition post 25. A buzzing sound was heard. With the probe 6 still grounded, the probe 7 was then touched to the alternator post 26. The absence of a buzzing sound was noted. With the probe 6 still grounded, the probe 7 was then touched to the stator post 27. A buzzing sound was heard. These results showed the voltage regulator 23 to be in good condition.

EXAMPLE 5

General Motors Built-In Voltage Regulator, Model No. 466

Figure 6:
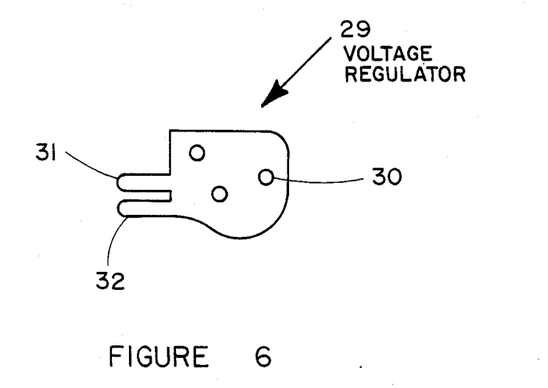
FIG. 6 is a schematic diagram of a General Motors electronic module, Model No. 9900B20, showing only those features of the module which are essential to the invention.

FIG. 6 is a schematic representation of a General Motors built-in voltage regulator, Model No. 466, designated generally by the number 29. Only those parts of the regulator 29 are shown which are pertinent to the testing of the regulator 29 according to the principles of the present invention. The voltage regulator 29 includes three ground posts 30, a field lead 31, and a positive lead 32. The probe 6 was touched to one of the ground posts 30, and the probe 7 to the field lead 31. The absence of a buzzing soung was noted. With the probe 6 still grounded, the probe 7 was touched to the positive lead 32. A buzzing sound was heard. These results showed the voltage regulator 29 to be in satisfactory condition.

EXAMPLE 6

General Motors Electronic Module, Model No. 9900B20

Figure 7:
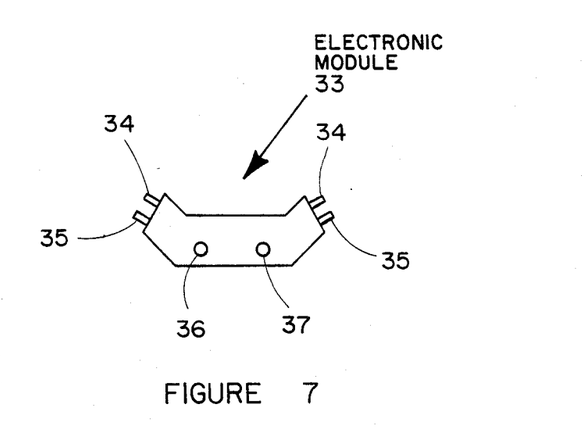
FIG. 7 is a schematic diagram of a diode tray, showing only those features which are essential to the invention.
Figure 8:
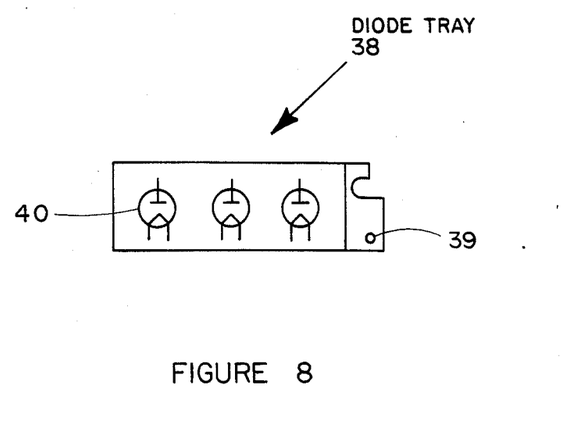
FIG. 8 is a schematic diagram of a General Motors built-in voltage regulator, Model No. 466, showing only those features which are related to the present invention.
Figure 9:
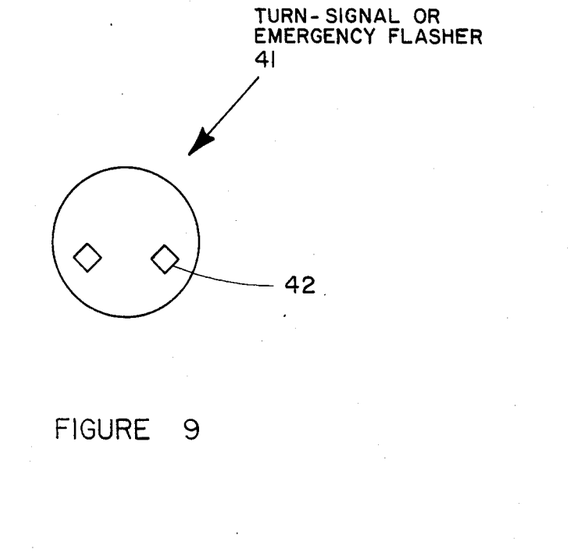
FIG. 9 is a schematic diagram of a turn-signal indicator or of an emergency flasher, showing only those features pertinent to the present invention.
Figure 10:
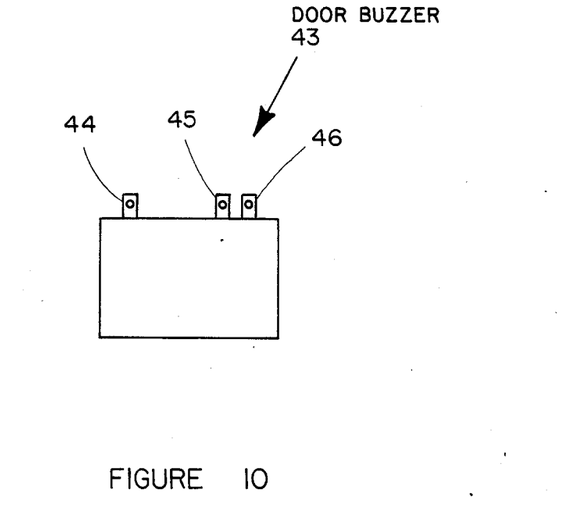
FIG. 10 is a schematic diagram of a buzzer for a door of an automotive vehicle, showing only those features which are pertinent to the present invention.
Figure 11:
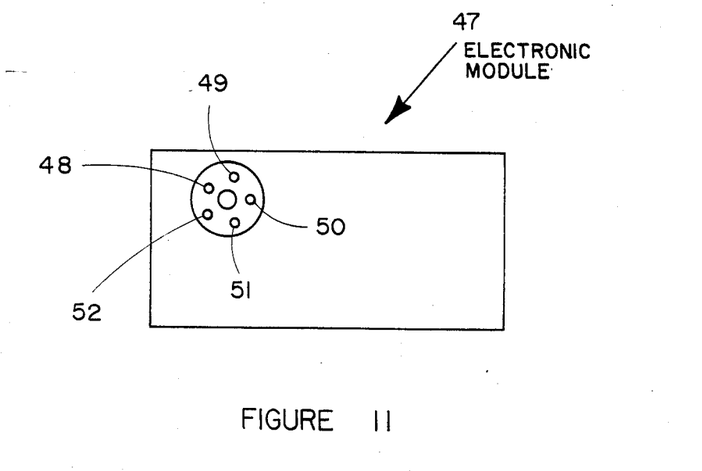
FIG. 11 is a schematic diagram of a Chrysler Corporation electronic module, Model No. 3874020, showing only those features pertinent to the present invention.
Figure 12:
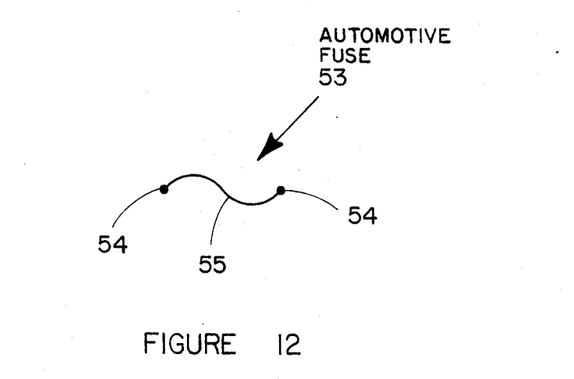
FIG. 12 is a schematic diagram of a fuse designed for use in an automotive vehicle, showing only those features which are pertinent to an understanding of the present invention.
Figure 13:
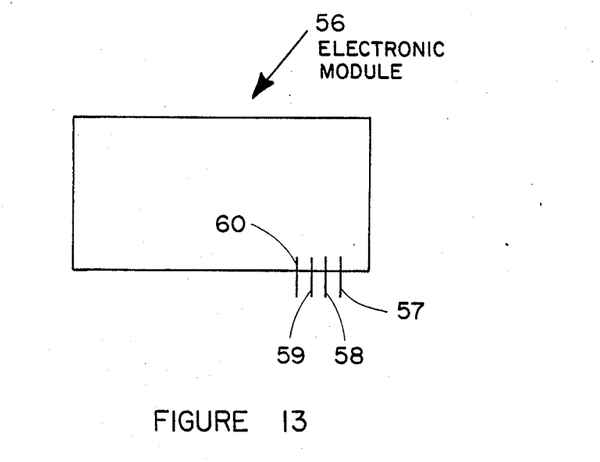
FIG. 13 is a schematic diagram of a Fort electronic module, Models No. A-1B, A-1D, and A-2B, showing only those features which are pertinent to an understanding of the present invention.

FIG. 7 is a schematic representation of a General Motors electronic module, Model No. 9900B20, indicated generally by the numeral 33. Only those features of the module 33 are included which are pertinent to the test about to be described. The module 33 includes a first ("B") terminal 34, a second ("C") terminal 35, a first connector post 36, and a second connector post 37. With the first probe 6 in contact with the first terminal (1) a source of direct electrical current, including positive and negative terminals;
(2) a buzzer which serves as a current detector;
(3) first and second contact probes 6 and 7, respectively, for making electrical contact with the voltage regulator to be tested; and
(4) means for connecting the source of current, the current detector, and the first and second probes;
(b) connecting the positive terminal of the currenet source to the buzzer;
(c) connecting the buzzer to the first probe;
(d) connecting the negative terminal of the current detector to the second probe;
(e) contacting the first connector post with the first probe, and one of the ground posts with the second probe;
(f) contacting the second connector post with the first probe, and one of the ground posts with the second probe; and
(g) rating the voltage regulator as in satisfactory condition if, and only if, a low buzzing sound was heard in step (e) and a loud buzzing sound in step (f).

2. A method for testing a solid-state voltage regulator 17 including a ground post 18, an ignition post 19, an alternator post 20, a stator post 21, and a field post 22, which comprises the steps of:
(a) providing
(1) a source of direct electrical current, including positive and negative terminals;
(2) a current detector comprising a buzzer and an incandescent lamp;
(3) first and second contact probes, for making electrical contact with the voltage regulator to be tested; and
(4) means for connecting the source of current, the current detector, and the first and second probes;
(b) connecting the positive terminal of the current source to the current detector;
(c) connecting the current detector to the first probe;
(d) connecting the negative terminal of the current source to the second probe;
(e) electrically grounding the first probe while establishing electrical contact between the second probe and the ignition post;
(f) electrically grounding the first probe while establishing electrical contact between the second probe and the alternator post;
(g) electrically grounding the first probe while establishing electrical contact between the second probe and the stator post;
(h) electrically grounding the first probe while establishing electrical contact between the second probe and the field post; and
(i) rating the condition of the solid-state voltage regulator as satisfactory if, and only if, (1) a buzzing sound was heard in steps (e), (f), and (h), but not in step (g); and (2) the lamp was dimly illuminated in step (g).

3. A method for testing a mechanical voltage regulator 23 including a ground post 24, an ignition post 25, an alternator post 26, a stator post 27, and a field post 28, which comprises the steps of:
(a) providing
(1) a source of direct electrical current, including positive and negative terminals;
(2) a buzzer which serves as a current detector;
(3) first and second contact probes, for making electrical contact with the voltage regulator to be tested; and
(4) means for connecting the source of current, the buzzer, and the first and second probes;
(b) connecting the positive terminal of the current source to the buzzer;
(c) connecting the buzzer to the first probe;
(d) connecting the negative terminal of the current source to the second probe;
(e) electrically grounding the first probe while contacting the ignition post 25 with the second probe;
(f) electrically grounding the first probe while contacting the alternator post 26 with the second probe;
(g) electrically grounding the first probe while contacting the stator post 27 with the second probe; and
(h) rating the condition of the voltage regulator as satisfactory if, and only if, (1) a buzzing sound was heard in steps (e) and (g), but (2) not in step (f).

4. A method for testing a built-in voltage regulator 29 including three ground posts 30, a field lead 31, and a positive lead 32, which comprises the steps of:
(a) providing
(1) a source of direct electrical current, including positive and negative terminals;
(2) a buzzer which functions as a current detector;
(3) first and second contact probes, for making electrical contact with the voltage regulator to be tested; and
(4) means for connecting the source of current, the current detector, and the first and second probes;
(b) connecting the positive terminal of the current source to the buzzer;
(c) connecting the buzzer to the first probe;
(d) connecting the negative terminal of the current source to the second probe;
(e) electrically grounding the first probe; e.g., by establishing electrical contact with any one of the ground posts 30; while contacting the field lead 31 with the second probe;
(f) electrically grounding the first probe while contacting the positive lead 32 with the second probe; and
(g) rating the condition of the voltage regulator as satisfactory if, and only if, a buzzing sound was heard in step (f) but not in step (e).

5. A method for testing an electronic module 33 including a first terminal 34, a second terminal 35, a first connector post 36, and a second connector post 37, which comprises the steps of:
(a) providing
(1) a source of direct electrical current, including positive and negative terminals;
(2) a current detector selected from the group consisting of a buzzer and an incandescent lamp;
(3) first and second contact probes, for making electrical contact with the electronic module; and
(4) means for connecting the source of current, the current detector, and the first and second probes;
(b) connecting the positive terminal of the current source to the current detector;
(c) connecting the current detector to the first probe;
(d) connecting the negative terminal of the current source to the second probe;

(e) contacting the first terminal 34 with the first probe, and the first connector post 36 with the second probe;

(f) contacting the first terminal 34 with the first probe, and the second connector post 37 with the second probe;

(g) contacting the second terminal 35 with the first probe while contacting the second connector post 37 with the second probe;

(h) contacting the second terminal 35 with the first probe while contacting the first connector post 36 with the second probe; and (i) rating the condition of the electronic module as satisfactory if, and only if, a flow of electrical current was detected by the current detector in each and every step (e), (f), (g), and (h).

6. A method for testing an electronic module 47 including first, second, third, fourth, and fifth contact points 48, 49, 50, 51, and 52, respectively, which comprises the steps of:

(a) providing
  (1) a source of direct electrical current, including positive and negative terminals;
  (2) a buzzer which serves as a current detector;
  (3) first and second contact probes, for making electrical contact with the electrical module; and
  (4) means for connecting the source of current, the current detector, and the first and second probes;

(b) connecting the positive terminal of the current source to the current detector;

(c) connecting the current detector to the first probe;

(d) connecting the negative terminal of the current source to the second probe;

(e) grounding the first probe while contacting the first contact point 48 with the second probe;

(f) grounding the first probe while contacting, one at a time, the second, third, fourth, and fifth contact points with the second probe; and (g) rating the condition of the electronic module as satisfactory if, and only if, a flow of current was detected when each and every contact point was contacted in step (f), and a flow of current was not detected in step (e).

7. A method for testing an electronic module 56 including first, second, third, and fourth lead wires 57, 58, 59, and 60, respectively, which comprises the steps of:

(a) providing
  (1) a source of direct electrical current, including positive and negative terminals;
  (2) a current detector including a buzzer and an incandescent lamp;
  (3) first and second contact probes, for making electrical contact with the electronic module; and
  (4) means for connecting the source of current, the current detector, and the first and second probes;

(b) connecting the positive terminal of the current source to the current detector;

(c) connecting the current detector to the first probe;

(d) connecting the negative terminal of the current source to the second probe;

(e) contacting the fourth wire 60 with the first probe while contacting the first wire 57 with the second probe;

(f) contacting the fourth wire with the first probe while contacting the second wire 58 with the second probe;

(g) contacting the fourth wire with the first probe while contacting the third wire 59 with the second probe; and (h) rating the condition of the electronic module as satisfactory if, and only if, (1) the buzzer did not buzz in step (e), and (2) the lamp was illuminated in step (f) and (g).

* * * * *